United States Patent
Mun et al.

(10) Patent No.: US 7,646,250 B2
(45) Date of Patent: Jan. 12, 2010

(54) SIGNAL CONVERTER HAVING COMPENSATION UNIT

(75) Inventors: Hyun-Won Mun, Yongin-Si (KR); Il-Ku Nam, Anyang-Si (KR); Won Ko, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/008,769

(22) Filed: Jan. 14, 2008

(65) Prior Publication Data

US 2008/0191807 A1   Aug. 14, 2008

(30) Foreign Application Priority Data

Feb. 8, 2007   (KR) .................... 10-2007-0013241

(51) Int. Cl.
*H03F 3/04*   (2006.01)
(52) U.S. Cl. ..................................... 330/301
(58) Field of Classification Search ................. 330/301
See application file for complete search history.

(56) References Cited

U.S. PATENT DOCUMENTS 5,929,710 A    7/1999  Bien ........................ 330/301
6,731,163 B2   5/2004  Huckins et al. .............. 330/69
2003/0114129 A1*  6/2003  Jerng ......................... 455/323
2008/0252381 A1* 10/2008  Sanduleanu et al. ........ 330/301

OTHER PUBLICATIONS

Korean Patent Publication No. 100643608 to Kim, having Publication date of Nov. 1, 2006 (w/ English Abstract page).
Japanese Patent Publication No. 2001-136034 to Mamoru et al., having Publication date of May 18, 2001 (w/ English Abstract page).
Korean Patent Application No. 1019950014664 to Shin, having Publication date of May 18, 1998 (w/ English Abstract page).
Japanese Patent Application No. 04-023706 to Huijsing et al., having Publication date of May 18, 1993 (w/ English Abstract page).
Japanese Patent Application No. 10-1994-0025616 having Publication date of Dec. 28, 2001 (w/ English Abstract page).

* cited by examiner

*Primary Examiner*—Robert Pascal
*Assistant Examiner*—Khiem D Nguyen
(74) *Attorney, Agent, or Firm*—Monica H. Choi

(57) ABSTRACT

A signal converter includes a signal converting unit and a compensation unit. The signal converting unit generates intermediate differential signals at intermediate nodes in response to a single-ended signal. The compensation unit generates compensated differential signals at output nodes by minimizing phase and amplitude mismatch errors between the intermediate differential signals. The compensation unit includes a pair of transistors and a pair of capacitors configured in symmetry between the intermediate and output nodes. The signal converter of the present invention may be used to particular advantage in an RF receiver.

18 Claims, 7 Drawing Sheets

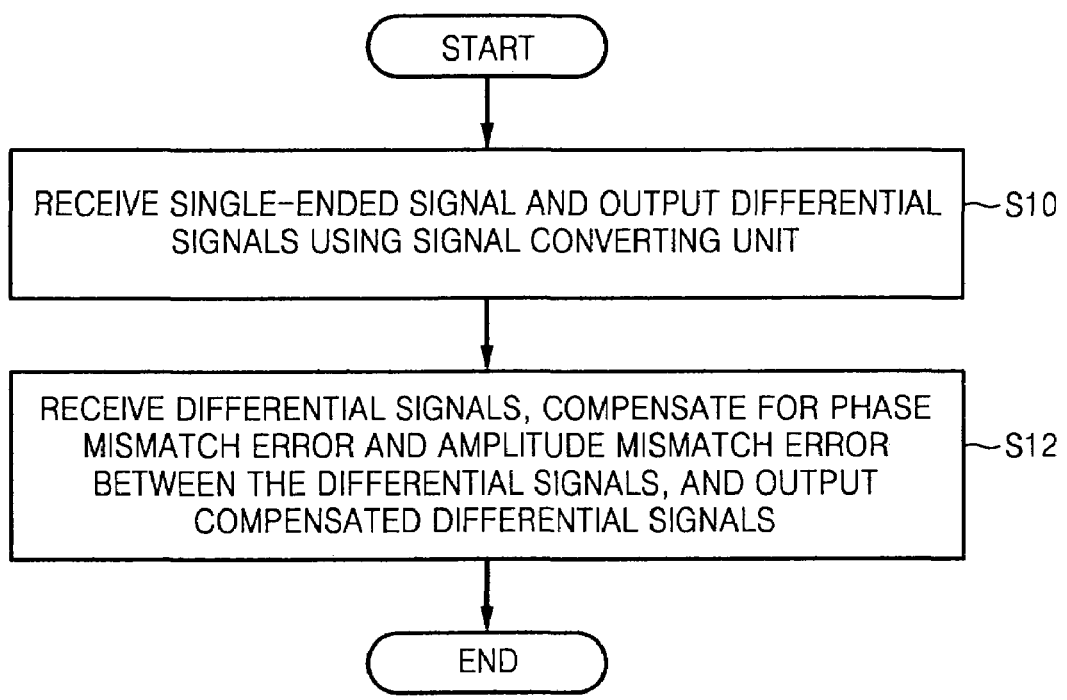

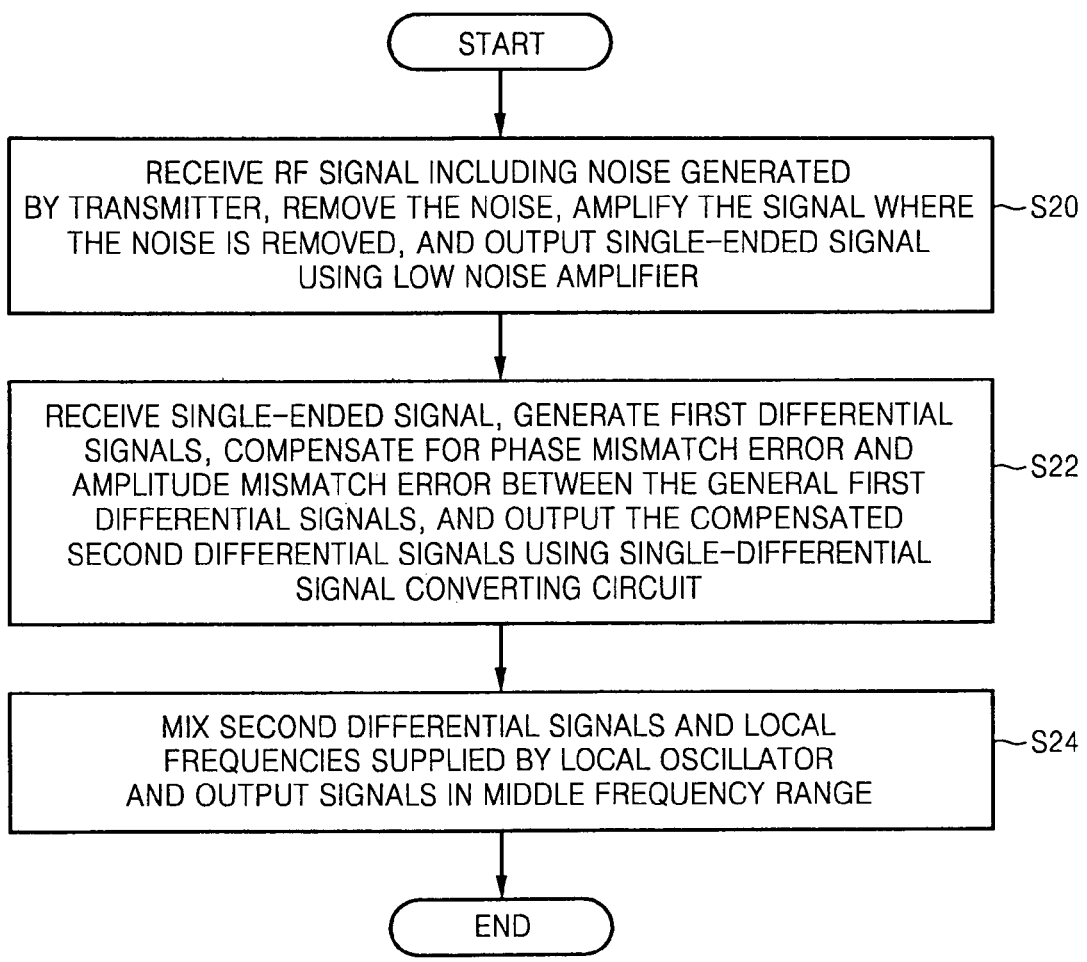

SIGNAL CONVERTER HAVING COMPENSATION UNIT

BACKGROUND OF THE INVENTION

This application claims priority under 35 USC § 119 to Korean Patent Application No. 2007-0013241, filed on Feb. 8, 2007 in the Korean Intellectual Property Office, the disclosure of which is incorporated herein in its entirety by reference.

1. Field of the Invention

The present invention relates generally to signal converters, and more particularly, to a signal converter having a compensation unit.

2. Background of the Invention

In general, a single-ended signal is measured with respect to a fixed potential, such as a ground voltage for example. The signal change of the single-ended signal in response to an input signal is slower than for differential signals, and the single-ended signal is more affected by noise. Accordingly, most circuits used in communication systems process differential signals with superior noise and impedance matching characteristics. In particular, the differential circuit structure is commonly adopted in a system-on-a-chip (SoC) where analog circuits, such as radio frequency (RF) circuits for example, and digital circuits are integrally formed.

Thus, for implementing a differential circuit structure, a signal converter for converting a single-ended signal to differential signals is desired. For example, the signal converter converts the single-ended signal input though an antenna at a receiving end of a communication system to differential signals in an RF frequency band.

FIG. 1 shows a single-ended to differential signal converter 5 according to the prior art as disclosed in U.S. Pat. No. 5,929,710. Referring to FIG. 1, the signal converter 5 receives a single-ended voltage signal Vin and outputs differential amplified current signals I1 and I2. However, in the signal converter 5 of FIG. 1, the differential current signals I1 and I2 may be distorted by the change width of the single-ended voltage signal Vin, noise generated by parasitic capacitances of first and second transistors M1 and M2, or the mismatch between the first and second transistors M1 and M2. For example, the differential current signals I1 and I2 may have different amplitudes (i.e., an amplitude mismatch error) and/or may not have a differential or complementary phase difference of 180° (i.e., a phase mismatch error).

In particular, the differential current signals I1 and I2 may be considerably distorted by the parasitic capacitances of the first and second transistors M1 and M2. Such signal distortion may disadvantageously reduce the frequency band of the communication system having the signal converter 5 of FIG. 1 according to the prior art.

SUMMARY OF THE INVENTION

Accordingly, a signal converter is formed with a compensation unit for compensating for an amplitude mismatch error and a phase mismatch error in the differential signals.

A signal converter according to an aspect of the present invention includes a signal converting unit and a compensation unit. The signal converting unit generates intermediate differential signals at intermediate nodes in response to a single-ended signal. The compensation unit generates compensated differential signals at output nodes by minimizing phase and amplitude mismatch errors between the intermediate differential signals. The compensation unit includes a pair of transistors and a pair of capacitors configured in symmetry between the intermediate and output nodes.

In an example embodiment of the present invention, the pair of transistors includes first and second compensating field effect transistors. The first compensating field effect transistor has a drain and a source coupled between a first intermediate node and a first output node. The second compensating field effect transistor has a drain and a source coupled between a second intermediate node and a second output node. The first compensating field effect transistor has a gate coupled to the second intermediate node, and the second compensating field effect transistor has a gate coupled to the first intermediate node.

In a further embodiment of the present invention, the pair of capacitors includes first and second compensating capacitors. The first compensating capacitor is coupled between a gate of the first compensating field effect transistor and the second intermediate node. The second compensating capacitor is coupled between a gate of the second compensating field effect transistor and the first intermediate node. The first and second compensating capacitors have a same capacitance. In an example embodiment of the present invention, the first and second compensating field effect transistors are NMOSFETs (N-channel metal oxide semiconductor field effect transistors).

In a further embodiment of the present invention, the compensation unit further includes a pair of impedance units coupled in symmetry between the output nodes and a high voltage supply.

In another embodiment of the present invention, the signal converting unit includes first and second converting field effect transistors. The first converting field effect transistor has a drain coupled to the first intermediate node, a source coupled to a low voltage supply, and a gate having the single-ended signal applied thereon. The second converting field effect transistor has a drain coupled to the second intermediate node, a source coupled to the low voltage supply, and a gate coupled to the first intermediate node.

In a further embodiment of the present invention, the signal converting unit further includes a converting capacitor coupled between the first intermediate node and the gate of the second converting field effect transistor. The first and second converting field effect transistors are NMOSFETs (N-channel metal oxide semiconductor field effect transistors).

The signal converter of the present invention may be used to particular advantage in an RF receiver. In that case, the RF receiver further includes a low noise amplifier and a mixer. The low noise amplifier generates the single-ended signal by amplifying and removing noise from an RF signal. The signal converter generates the compensated differential signals from the single-ended signal generated by the low noise amplifier. The mixer generates middle frequency differential signals by mixing the compensated differential signals with local frequency differential signals.

In this manner, the compensated differential signals are ensured of having a substantially same amplitude and a complementary phase difference of 180° such that the RF receiver may operate with little signal distortion.

BRIEF DESCRIPTION OF THE DRAWINGS

The above and other features and advantages of the present invention will become more apparent when described in detailed exemplary embodiments thereof with reference to the attached drawings in which:

FIG. 6 is a flowchart of steps during operation of the signal converter of FIG. 2, according to an example embodiment of the present invention; and FIG. 7 is a flowchart of steps during operation of the RF receiver of FIG. 5, according to an example embodiment of the present invention.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

Figure 1:
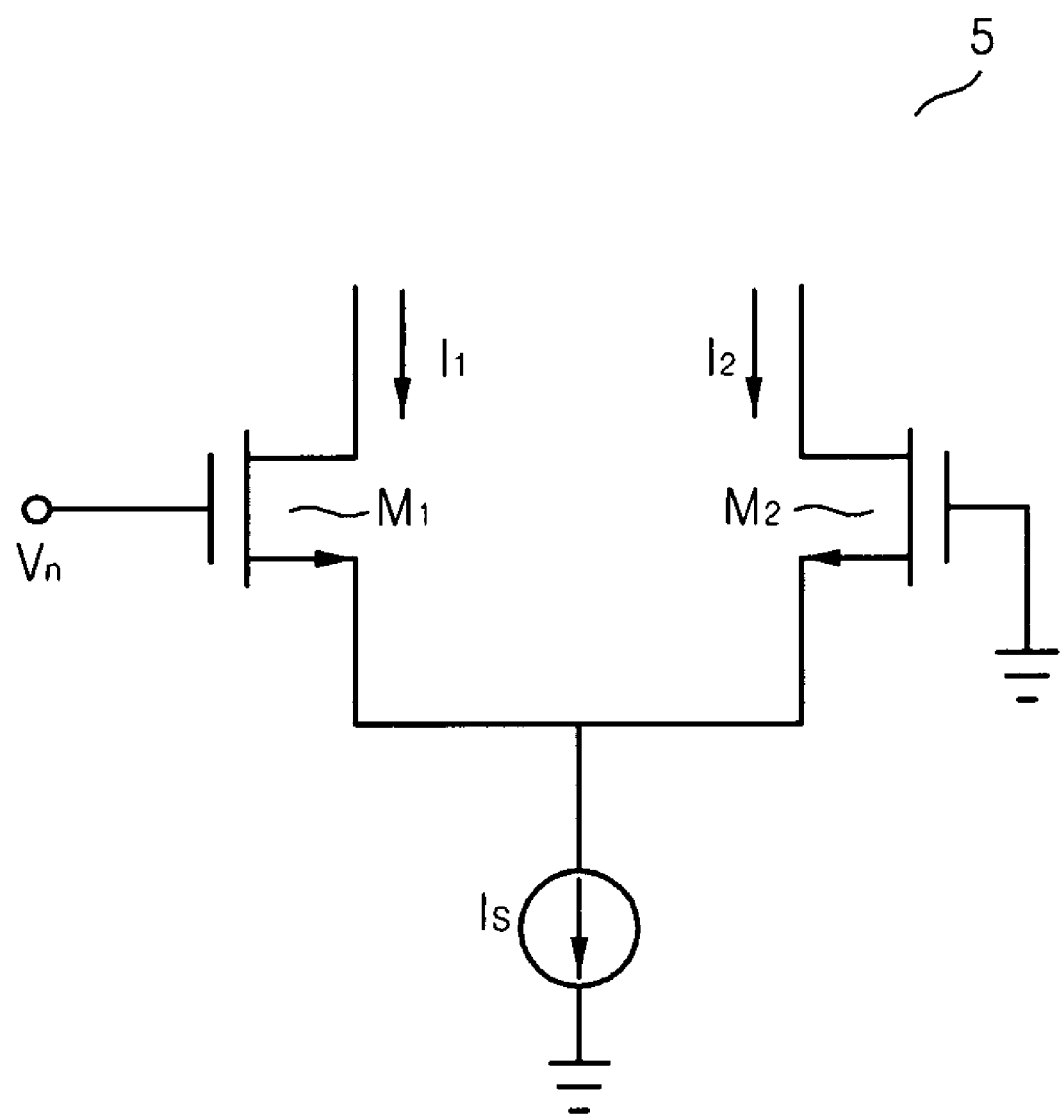
FIG. 1 is a circuit diagram of a single-ended to differential signal converter according to the prior art.
Figure 2:
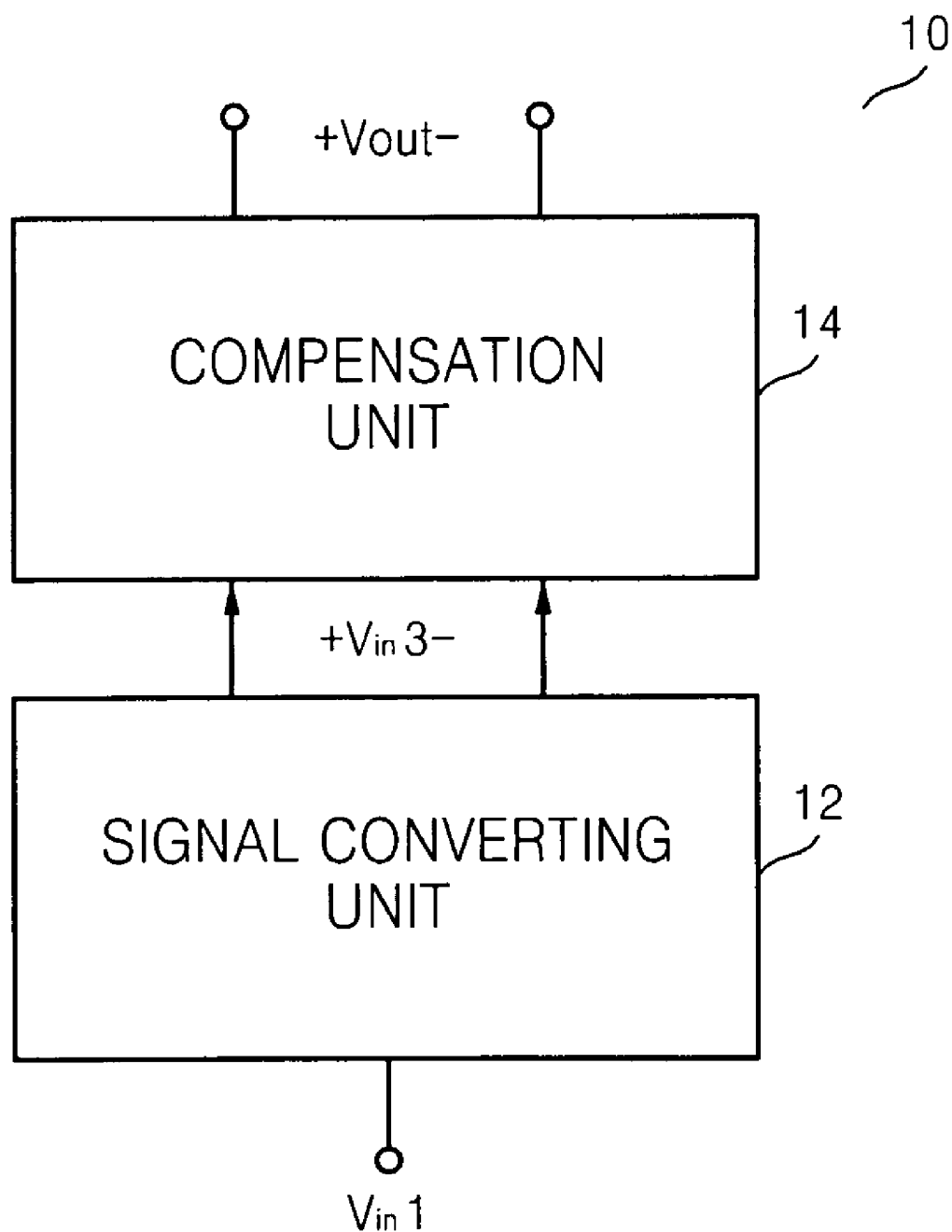
FIG. 2 is a block diagram of a signal converter with a compensation unit, according to an example embodiment of the present invention.
Figure 3:
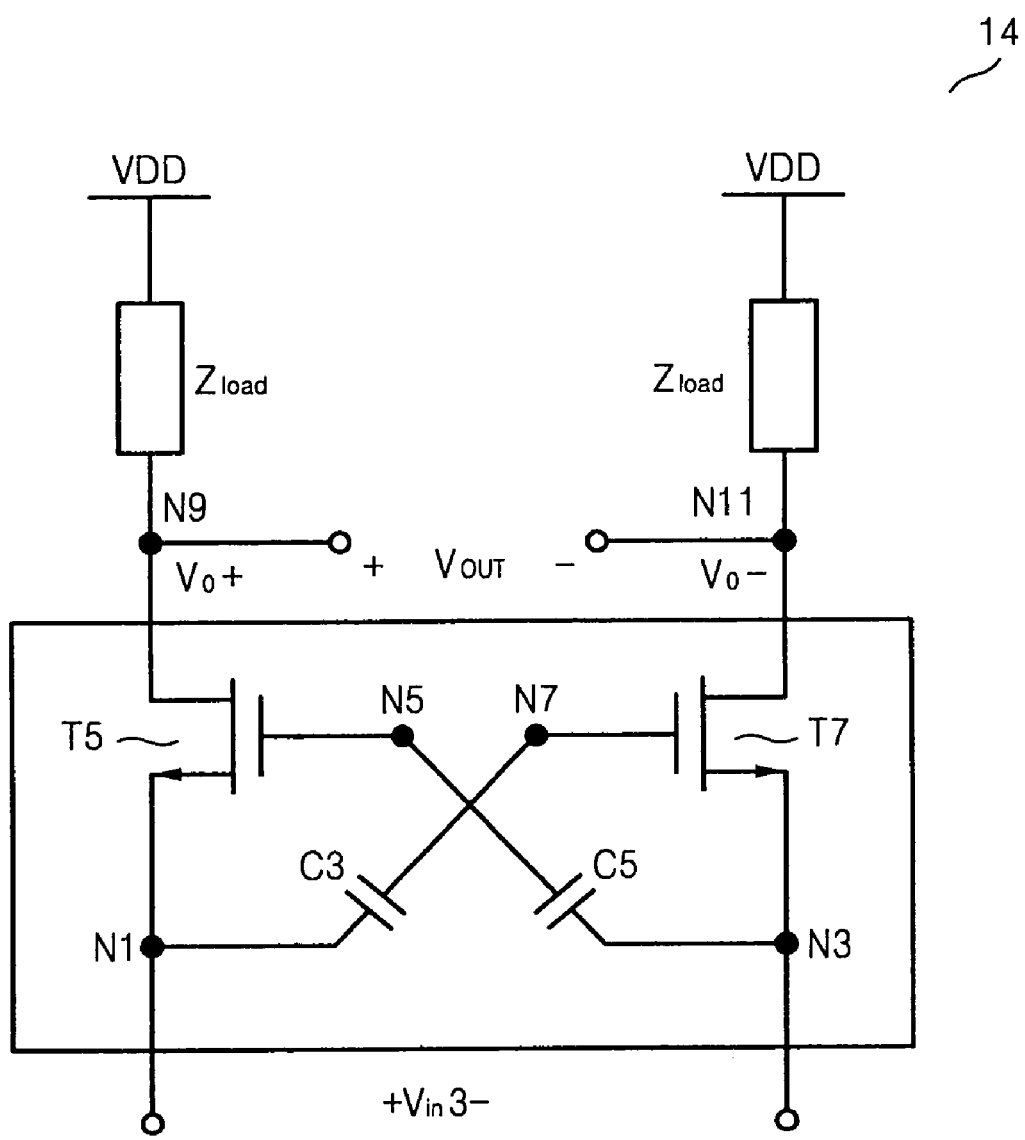
FIG. 3 is a circuit diagram of the compensation unit in FIG. 2, according to an example embodiment of the present invention.
Figure 4:
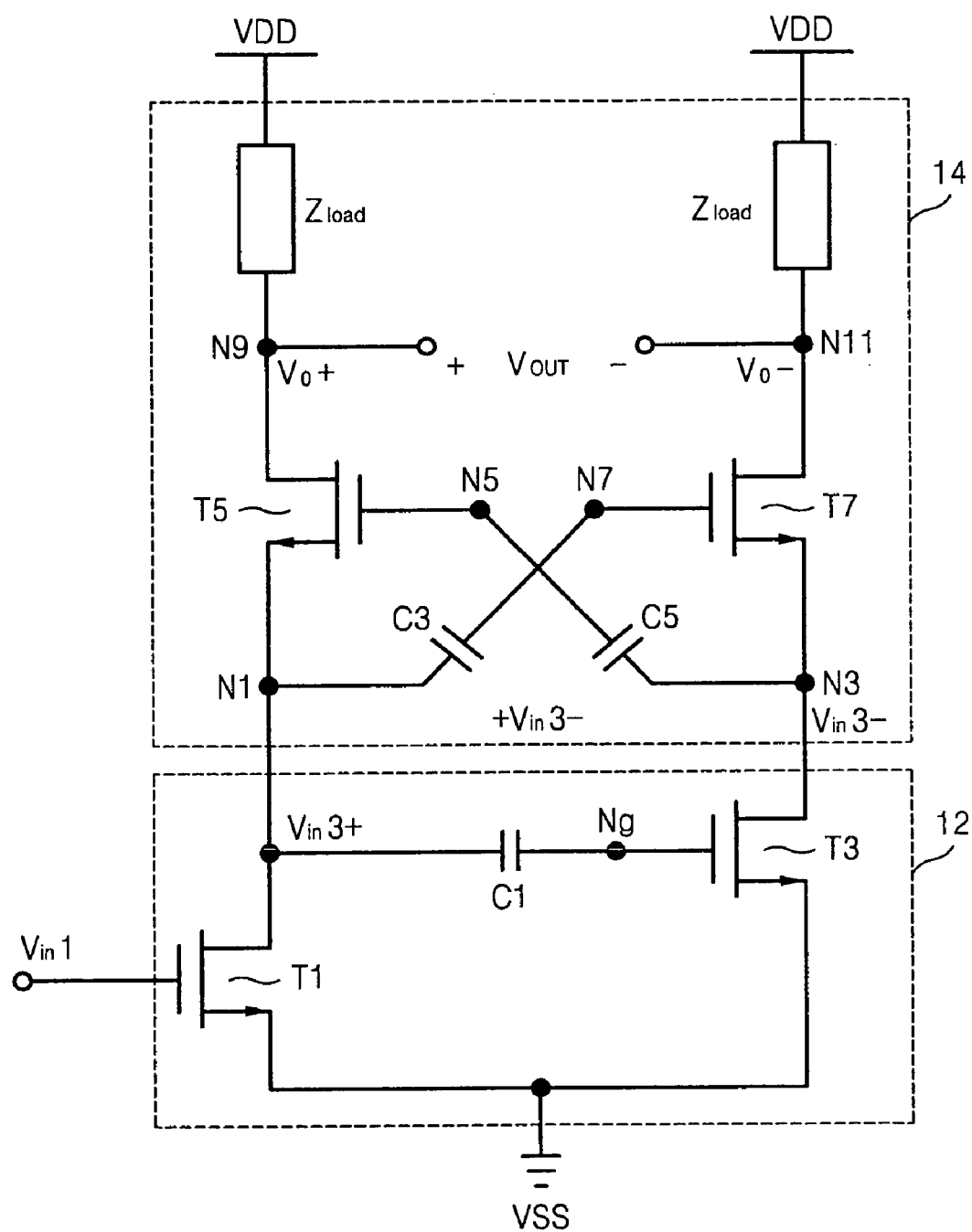
FIG. 4 is a circuit diagram of the signal converter of FIG. 2, according to an example embodiment of the present invention.

FIG. 2 is a block diagram of a signal converter 10, that may be embodied at a receiving end of a communication system for example, according to an embodiment of the present invention. The signal converter 10 includes a signal converting unit 12 and a compensation unit 14. FIG. 3 is a circuit diagram of the compensation unit 14 of FIG. 2. FIG. 4 is a circuit diagram of the signal converter 10 of FIG. 2.

The signal converting unit 12 generates intermediate differential signals Vin3+ and Vin3− in response to a single-ended signal Vin1. The signal converting unit 12 includes a first converting NMOSFET (N-channel metal oxide semiconductor field effect transistor) T1, a second converting NMOSFET (N-channel metal oxide semiconductor field effect transistor) T3, and a converting capacitor C1.

The first converting NMOSFET T1 has a drain coupled to a first intermediate node N1 and a source coupled to a low voltage supply VSS such as a ground voltage node. The first converting NMOSFET T1 also has a gate having the single-ended signal Vin1 applied thereon. The second converting NMOSFET T3 has a drain coupled to a second intermediate node N3 and a source coupled to the low voltage supply VSS. The converting capacitor C1 is coupled between the first intermediate node N1 and a gate Ng of the second converting NMOSFET T3.

The first converting NMOSFET T1 in response to the single-ended signal Vin1 forms a current path between the first intermediate node N1 and the low voltage supply VSS. The converting capacitor C1 charges/discharges the voltage between the first intermediate node N1 and the gate Ng of the second converting NMOSFET T3. The second converting NMOSFET T3 in response to the voltage at the gate Ng forms a current path between the second intermediate node N3 and the low voltage supply VSS.

In this manner, the converting unit 12 generates intermediate differential signals Vin3+ and Vin3− at the intermediate nodes N1 and N3, respectively. The intermediate differential signals Vin3+ and Vin3− from the converting unit 12 have amplitude mismatch error when the amplitudes of the intermediate differential signals Vin3+ and Vin3− are not equal. In addition, the intermediate differential signals Vin3+ and Vin3− also have phase mismatch error when the phase difference between the intermediate differential signals Vin3+ and Vin3− is not equal to 180°.

The compensation unit 14 receives the intermediate differential signals Vin3+ and Vin3− to compensate for such phase mismatch error and such amplitude mismatch error between the intermediate differential signals Vin3+ and Vin3−. The compensation unit 14 generates compensated differential signals Vo+ and Vo− that have substantially same amplitudes and that have a phase difference of substantially 180°.

The compensation unit 14 includes a first compensating NMOSFET (N-channel metal oxide semiconductor field effect transistor) T5 and a second compensating NMOSFET (N-channel metal oxide semiconductor field effect transistor) T7. The compensation unit 13 also includes a first compensating capacitor C3 and a second compensating capacitor C5.

The first compensating NMOSFET T5 has a drain coupled to a first output node N9 and a source coupled to the first intermediate node N1. The second compensating NMOSFET T7 has a drain coupled to a second output node N11 and a source coupled to the second intermediate node N3. The first compensating capacitor C3 is coupled between the first intermediate node N1 and a gate N7 of the second compensating NMOSFET T7. The second compensating capacitor C5 is coupled between the second intermediate node N3 and a gate N5 of the first compensating NMOSFET T5.

The first compensating NMOSFET T5 in response to a voltage at its gate N5 forms a current path between the first output node N9 and the first intermediate node N1. The second compensating NMOSFET T7 in response to a voltage at its gate N7 forms a current path between the second output node N11 and the second intermediate node N3.

The first compensating capacitor C3 charges/discharges the voltage between the first intermediate node N1 and the gate N7 of the second compensating NMOSFET T7. The second compensating capacitor C5 charges/discharges the voltage between the second intermediate node N3 and the gate N5 of the first compensating NMOSFET T5.

The first and second compensating NMOSFETs T5 and T7 are designed to have substantially same device characteristics. In addition, the first and second compensating capacitors C3 and C5 are fabricated to have substantially a same capacitance. Thus, the first and second compensating NMOSFETs T5 and T7 and the first and second compensating capacitors C3 and C5 are fabricated to be configured substantially symmetrical between the first and second intermediate nodes N1 and N3 and between the first and second output nodes N9 and N11.

The compensation unit 14 further includes a respective impedance unit Zload coupled between each of the output nodes N9 and N11 and a high voltage supply VDD. In an embodiment of the present invention, each impedance unit Zload has a same impedance. For example, each impedance unit Zload may be a resistor having a same resistance. In addition, the two impedance units Zload are configured to be in symmetry between the output nodes N9 and N11.

Operation of the compensation unit 14 for compensating the phase mismatch error $\phi_{err}$ and the amplitude mismatch error $\Delta_{err}$ between the intermediate differential signals Vin3+ and Vin3− to generate the compensated differential signals Vo+ and Vo− is now described starting with the following equations:

$$Vin3+ = \sin(2\pi ft)$$

$$Vin3- = (1+\Delta_{err})\sin(2\pi ft + \pi + \phi_{err})$$

In the above equations, Vin3+ is a voltage at the first intermediate node N1, and Vin3− is the voltage at the second intermediate node N3, for the intermediate differential voltage signals Vin3+ and Vin3− being formed at the first and second intermediate nodes N1 and N3, respectively.

A voltage gain $G_{cc}$ at the first output node N9 with respect to the second intermediate node N3 is expressed as follows:

$$G_{cc} = \frac{C_c}{C_c + C_{gs}} = \frac{1}{1 + C_{gs}/C_c} \approx 1 \text{ if } C_c \gg C_{gs}$$

In the above equation, $C_c$ is the capacitance of the second compensating capacitor C5, and $C_{gs}$ is a gate-to-source parasitic capacitance of the first compensating NMOSFET T5. Note that such a voltage gain $G_{cc}$ is about 1 when the capacitance $C_c$ of the second compensating capacitor C5 is substantially greater than the gate-to-source parasitic capacitance $C_{gs}$ of the first compensating NMOSFET T5 when such gate-to-source parasitic capacitance $C_{gs}$ is negligible.

In addition, the voltage gain at the second output node N11 with respect to the first intermediate node N1 is expressed similarly as the equation above for the gain $G_{cc}$ at the first output node N9 with respect to the second intermediate node N3. Such gains are similar because the capacitance of the first compensating capacitor C3 is substantially the same as that of the second compensating capacitor C5 and because the gate-to-source parasitic capacitance $C_{gs}$ of the second compensating NMOSFET T7 is substantially the same as that of the first compensating NMOSFET T5.

Thus, the voltage Vo+ at the first output node N9 is expressed as follows:

$$Vo+= g_m\sin(2\pi ft) - G_{cc}g_m(1 + \Delta_{err})\sin(2\pi ft + \pi + \phi_{err})$$
$$\approx g_m\sin(2\pi ft) + g_m(1 + \Delta_{err})\sin(2\pi ft + \phi_{err})$$

In the equation above, the $g_m$ is a voltage gain of the first compensating NMOSFET T5 which is substantially same as that of the second compensating NMOSFET T7. Also, the voltage Vo− at the second output node N11 is expressed as follows:

$$Vo- = -G_{cc}g_m\sin(2\pi ft) + g_m(1 + \Delta_{err})\sin(2\pi ft + \pi + \phi_{err})$$
$$\approx -g_m\sin(2\pi ft) - g_m(1 + \Delta_{err})\sin(2\pi ft + \phi_{err})$$

As a result, the relationship between the voltages Vo+ and Vo− at the first and second output nodes N9 and N11, respectively, is expressed as follows:

$$Vo+=-(Vo-)$$

Note that the compensated differential signals Vo+ and Vo− at the first and second output nodes N9 and N11, respectively, have a same amplitude and a phase difference of 180°, even when the phase mismatch error $\phi_{err}$ and the amplitude mismatch error $\Delta_{err}$ exist between the intermediate differential signals Vin3+ and Vin3−.

Figure 5:
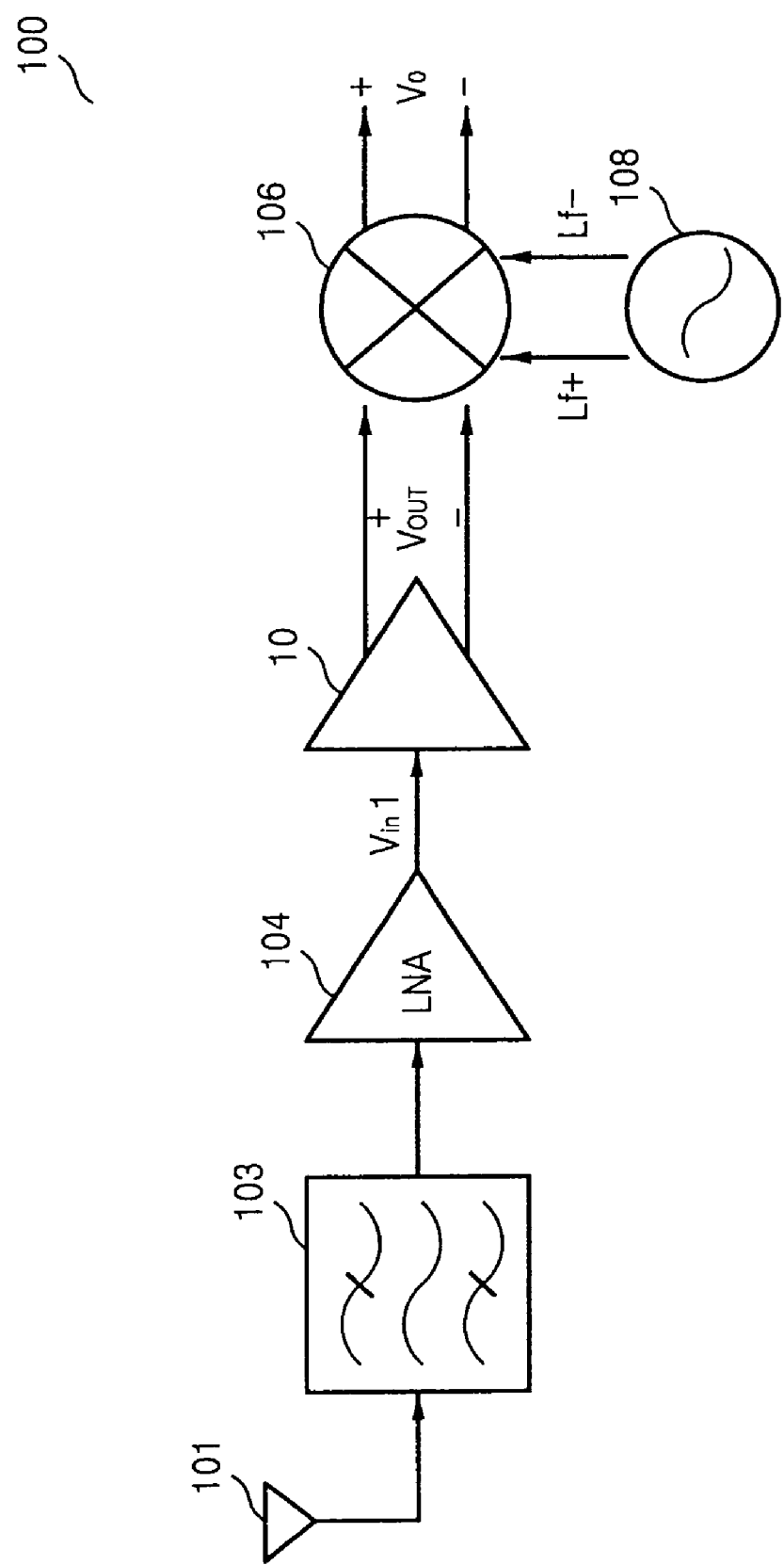
FIG. 5 is a block diagram of an RF receiver including the signal converter of FIG. 2, according to an example embodiment of the present invention.

FIG. 5 is a block diagram of an RF receiver 100 having the signal converter 10 of FIG. 2, according to an embodiment of the present invention. Referring to FIGS. 2, 3, 4, and 5, the RF receiver 100 includes an antenna 101, a duplexer 103, a low noise amplifier (LNA) 104, the signal converter 10, a mixer 106, and a local oscillator (LO) 108.

The antenna 101 receives an RF signal (not shown) which includes noise generated from a transmitter (not shown). The duplexer 103 transmits the received RF signal to the LNA 104. The LNA 104 receives the RF signal, removes the noise from the RF signal, and amplifies the RF signal with the noise removed to generate a single-ended signal Vin1.

The signal converter 10 receives the single-ended signal Vin1 from the LNA 104. The signal converter 10 includes the converting unit 12 that generates intermediate differential signals Vin3+ and Vin3− from the single-ended signal Vin1, similarly as described above in reference to FIGS. 2, 3, and 4. In addition, the signal converter 10 also includes the compensation unit 14 that compensates for the phase mismatch error $\phi_{err}$ and the amplitude mismatch error $\Delta_{err}$ between the intermediate differential signals Vin3+ and Vin3− to generate compensated differential signals Vo+ and Vo−, similarly as described above in reference to FIGS. 2, 3, and 4. Vout in FIG. 5 is the difference between Vo+ and Vo−.

The mixer 106 mixes the compensated differential signals Vo+ and Vo− and local frequency differential signals Lf+ and Lf− supplied by the LO 108 to generate middle frequency differential signals as illustrated in FIG. 5. For example, the mixer 106 is a down mixer in an example embodiment of the present invention. The LO 108 generates the local frequency differential signals Lf+ and Lf− that are mixed with the compensated differential signals Vo+ and Vo− to generate the middle frequency differential signals from the mixer 106.

FIG. 6 is a flowchart of steps during operation of the signal converter 10 of FIG. 2, according to an embodiment of the present invention. Referring to FIGS. 2, 3, 4, and 6, the signal converting unit 12 receives the single-ended signal Vin1 and generates the intermediate differential signals Vin3+ and Vin3− in response to the single-ended signal Vin1 (step S10 of FIG. 6). The compensation unit 14 compensates for the phase mismatch error $\phi_{err}$ and the amplitude mismatch error $\Delta_{err}$ between the intermediate differential signals Vin3+ and Vin3− to generate the compensated differential signals Vo+ and Vo− (step S12 of FIG. 6).

FIG. 7 is a flowchart of steps during operation of the RF receiver 100 of FIG. 5, according to an embodiment of the present invention. Referring to FIGS. 2, 3, 4, 5 and 7, the LNA 104 receives the RF signal having noise generated by a transmitter, removes such noise, and amplifies the RF signal having the noise removed to generate the single-ended signal Vin1 (step S20 of FIG. 7). The signal converter 10 receives the single-ended signal Vin1, and has the converting unit 12 that generates the intermediate differential signals Vin3+ and Vin3− in response to the single-ended signal Vin1 (step S22 of FIG. 7).

The signal converter 10 also includes the compensating unit 14 that compensates for the phase mismatch error $\phi_{err}$ and the amplitude mismatch error $\Delta_{err}$ between the intermediate differential signals Vin3+ and Vin3− to generate the compensated differential signals Vo+ and Vo− with Vout=Vo+−Vo− (step S22 of FIG. 7). The mixer 106 mixes the compensated differential signals Vo+ and Vo− and the local frequency differential signals Lf+ and Lf− supplied by the LO 108 to generate the middle frequency differential signals (step S24 of FIG. 7).

In this manner, the signal converter 10 includes the compensating unit 14 that compensates for the amplitude mismatch error and the phase mismatch error from the converting unit 12. Thus, the differential signals Vo+ and Vo− generated by the signal converter 10 have little signal distortion such that the RF receiver 100 may operate at high frequency.

While the present invention has been particularly shown and described with reference to an exemplary embodiment thereof, it will be understood by those of ordinary skill in the art that various changes in form and details may be made therein without departing from the spirit and scope of the present invention as defined by the following claims. The present invention is limited only as defined in the following claims and equivalents thereof.

What is claimed is:

1. A signal converter comprising:
a signal converting unit for generating intermediate differential signals at intermediate nodes in response to a single-ended signal, wherein the signal converting unit includes:
a first converting field effect transistor having a drain coupled to a first intermediate node, a source coupled to a low voltage supply, and a gate having the single-ended signal applied thereon; and
a second converting field effect transistor having a drain coupled to a second intermediate node, a source coupled to the low voltage supply, and a gate coupled to the first intermediate node; and
a compensation unit for generating compensated differential signals at output nodes by minimizing phase and amplitude mismatch errors between the intermediate differential signals, the compensation unit including:
a pair of transistors and a pair of capacitors configured in symmetry between the intermediate and output nodes.

2. The signal converter of claim 1, wherein the pair of transistors includes:
a first compensating field effect transistor having a drain and a source coupled between a first intermediate node and a first output node; and
a second compensating field effect transistor having a drain and a source coupled between a second intermediate node and a second output node.

3. The signal converter of claim 2, wherein the first compensating field effect transistor has a gate coupled to the second intermediate node, and wherein the second compensating field effect transistor has a gate coupled to the first intermediate node.

4. The signal converter of claim 3, wherein the pair of capacitors includes:
a first compensating capacitor coupled between a gate of the first compensating field effect transistor and the second intermediate node; and
a second compensating capacitor coupled between a gate of the second compensating field effect transistor and the first intermediate node.

5. The signal converter of claim 4, wherein the first and second compensating capacitors have a same capacitance.

6. The signal converter of claim 4, wherein the first and second compensating field effect transistors are NMOSFETs (N-channel metal oxide semiconductor field effect transistors).

7. The signal converter of claim 1, wherein the signal converting unit further includes:
a converting capacitor coupled between the first intermediate node and the gate of the second converting field effect transistor.

8. The signal converter of claim 1, wherein the first and second converting field effect transistors are NMOSFETs (N-channel metal oxide semiconductor field effect transistors).

9. The signal converter of claim 1, wherein the compensation unit further includes:
a pair of impedance units coupled in symmetry between the output nodes and a high voltage supply.

10. An RF receiver comprising:
a low noise amplifier for generating a single-ended signal by amplifying and removing noise from an RF signal;
a signal converter for generating compensated differential signals from the single-ended signal, wherein the signal converter includes:
a signal converting unit for generating intermediate differential signals at intermediate nodes in response to the single-ended signal, wherein the signal converting unit includes:
a first converting field effect transistor having a drain coupled to a first intermediate node, a source coupled to a low voltage supply, and a gate having the single-ended signal applied thereon; and
a second converting field effect transistor having a drain coupled to a second intermediate node, a source coupled to the low voltage supply, and a gate coupled to the first intermediate node; and
a compensation unit for generating the compensated differential signals at output nodes by minimizing phase and amplitude mismatch errors between the intermediate differential signals, the compensation unit including:
a pair of transistors and a pair of capacitors configured in symmetry between the intermediate and output nodes; and
a mixer for mixing the compensated differential signals with local frequency differential signals to generate middle frequency differential signals.

11. The RF receiver of claim 10, wherein the pair of transistors includes:
a first compensating field effect transistor having a drain and a source coupled between a first intermediate node and a first output node; and
a second compensating field effect transistor having a drain and a source coupled between a second intermediate node and a second output node.

12. The RF receiver of claim 11, wherein the first compensating field effect transistor has a gate coupled to the second intermediate node, and wherein the second compensating field effect transistor has a gate coupled to the first intermediate node.

13. The RF receiver of claim 12, wherein the pair of capacitors includes:
a first compensating capacitor coupled between a gate of the first compensating field effect transistor and the second intermediate node; and
a second compensating capacitor coupled between a gate of the second compensating field effect transistor and the first intermediate node.

14. The RF receiver of claim 13, wherein the first and second compensating capacitors have a same capacitance.

15. The RF receiver of claim 13, wherein the first and second compensating field effect transistors are NMOSFETs (N-channel metal oxide semiconductor field effect transistors).

16. The RE receiver of claim 10, wherein the signal converting unit further includes:
a converting capacitor coupled between the first intermediate node and the gate of the second converting field effect transistor.

17. The RF receiver of claim 10, wherein the first and second converting field effect transistors are NMOSFETs (N-channel metal oxide semiconductor field effect transistors).

18. The RF receiver of claim 10, wherein the compensation unit further includes:
a pair of impedance units coupled in symmetry between the output nodes and a high voltage supply.

* * * * *